United States Patent
Yamazaki et al.

[11] Patent Number: 6,118,506
[45] Date of Patent: *Sep. 12, 2000

[54] ELECTRO-OPTICAL DEVICE AND METHOD OF FABRICATING SAME

[75] Inventors: Shunpei Yamazaki, Tokyo; Jun Koyama; Naoaki Yamaguchi, both of Kanagawa; Katunobu Awane, Nara; Funiaki Funada, Nara; Yoshitaka Yamamoto, Nara, all of Japan

[73] Assignee: Semiconductor Energy Laboratory Co., Ltd., Kanagawa-ken, Japan

[*] Notice: This patent is subject to a terminal disclaimer.

[21] Appl. No.: 09/161,161

[22] Filed: Sep. 25, 1998

Related U.S. Application Data

[63] Continuation of application No. 08/808,453, Feb. 28, 1997, Pat. No. 5,815,226.

[30] Foreign Application Priority Data

Feb. 29, 1996 [JP] Japan ........................... 8-71074
Oct. 7, 1996 [JP] Japan ........................... 8-286036

[51] Int. Cl.⁷ .................... G02F 1/1333; G02F 1/1343
[52] U.S. Cl. .................... 349/111; 349/38; 349/138
[58] Field of Search .................... 349/138, 139, 349/111, 38

[56] References Cited

U.S. PATENT DOCUMENTS

| | | | |
|---|---|---|---|
| 5,708,486 | 1/1998 | Miyawaki et al. | 349/113 |
| 5,726,720 | 3/1998 | Watanable et al. | 349/138 |
| 5,784,132 | 7/1998 | Hashimoto | 349/138 |
| 5,815,226 | 9/1998 | Yamazaki et al. | 349/111 |

Primary Examiner—William L. Sikes
Assistant Examiner—Dung Nguyen
Attorney, Agent, or Firm—Fish & Richardson P.C.

[57] ABSTRACT

An active matrix liquid crystal display having a high aperture ratio is provided. Retaining capacitors are created between a black matrix and pixel electrodes via a dielectric layer made from an organic resinous material or inorganic material. Those regions of the black matrix which cover TFTs are fully utilized. Therefore, wider area can be used to display an image than heretofore. In the present invention, the difference in relative dielectric constant between different dielectric layers is employed. Therefore, retaining capacitors can be created without the need to take account of parasitic capacitance.

18 Claims, 7 Drawing Sheets

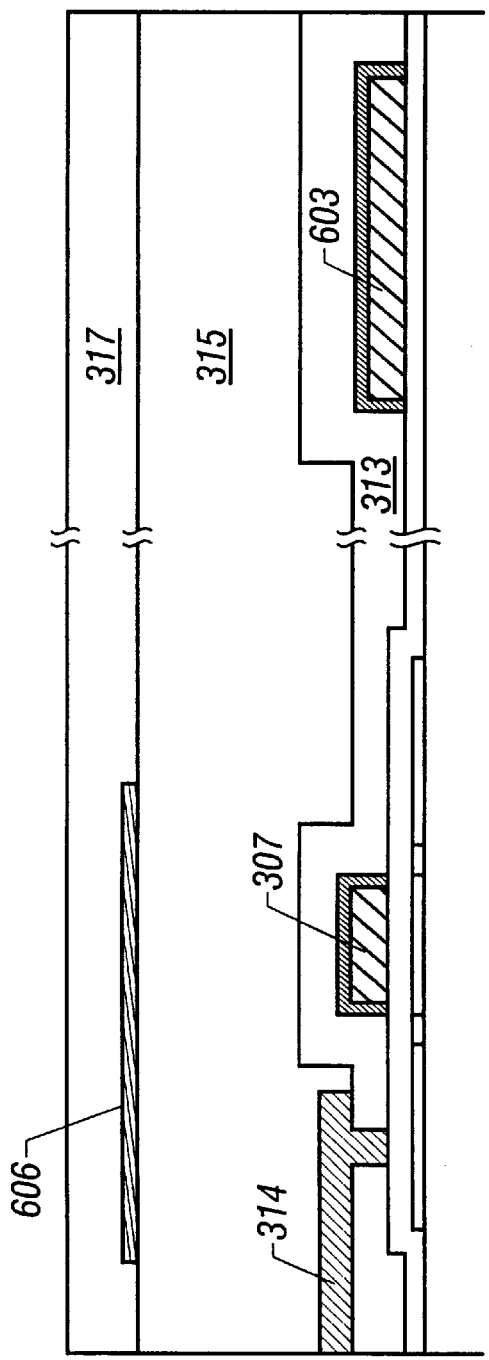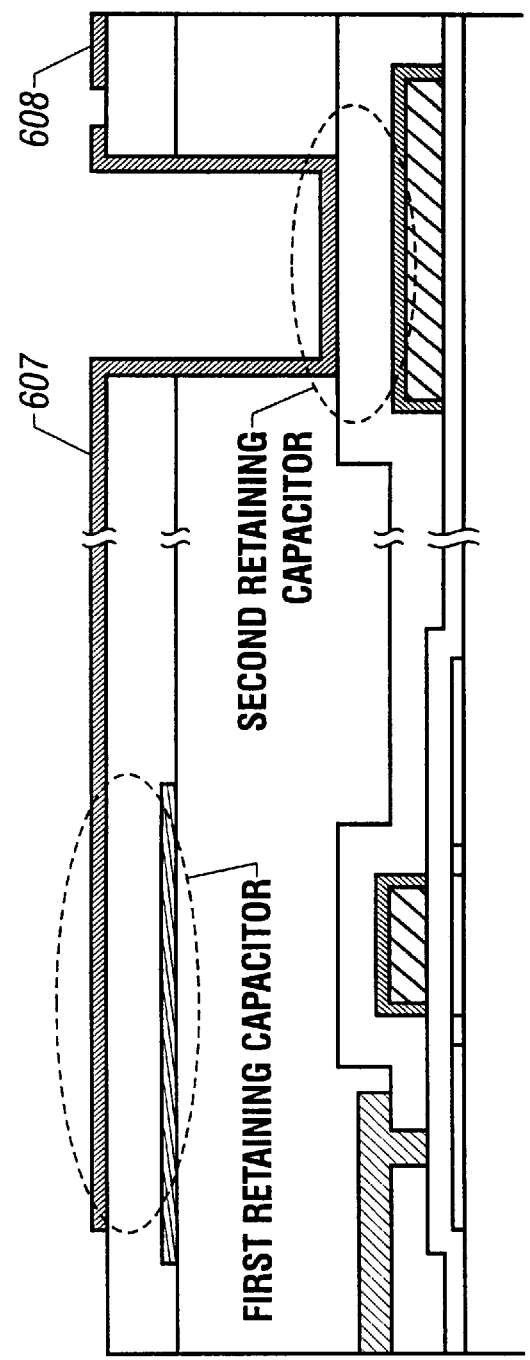

ELECTRO-OPTICAL DEVICE AND METHOD OF FABRICATING SAME

This application is a continuation of Ser. No. 08/808,453 filed Feb. 28, 1997 now U.S. Pat. No. 5,815,226.

BACKGROUND OF THE INVENTION

1. Field of the Invention

The present invention relates to a liquid crystal display construction including semiconductor devices which are made of a crystalline silicon film and act as control devices and, more particularly, to the construction of pixel regions of an active matrix liquid crystal display.

2. Description of the Related Art

In recent years, techniques for fabricating thin-film transistors (TFTS) on cheap glass substrates have evolved rapidly because there is an increasing demand for active matrix liquid crystal displays.

In an active matrix liquid crystal display, millions of pixels are arranged in rows and columns. At least one TFT is disposed at each of these pixels. Electric charge going into and out of each pixel electrode is controlled by the switching function of the TFT.

A liquid crystal material is sandwiched between each pixel electrode and a counter electrode to form one kind of capacitor. Accordingly, the electrooptical characteristics of the liquid crystal material can be varied by controlling the movement of the electric charge into and out of the capacitor by means of the TFT. Thus, the light transmitted through the liquid crystal panel can be controlled. As a result, an image can be displayed.

In the capacitor of this construction, the retained voltage gradually drops for leakage and other causes. This varies the electrooptical characteristics of the liquid crystal material, thus impairing the contrast of the displayed image.

Accordingly, it is common practice to place a separate capacitor, called retaining capacitor, in series with the capacitor comprising the liquid crystal material. This replenishes electric charge lost from the capacitor comprising the liquid crystal material due to the leakage or the like.

The structure of pixel regions of the prior art active matrix liquid crystal display is shown in FIG. 1(A), where gate lines 101 and capacitor lines 102 running parallel to the gate lines intersect data lines 103 like a matrix. Pixel electrodes 104 are disposed inside regions (hereinafter referred to as the pixel regions) surrounded by these lines. The capacitor lines 102 and pixel electrodes 104 are at different levels and overlap each other via first and second interlayer dielectric films, thus forming retaining capacitors.

A semiconductor layer 105 forms the active layer of a TFT. Indicated by 106 and 107 are contacts to the data lines and pixel electrodes, respectively.

In FIG. 1(A), the pixel regions surrounded by the gate lines 101 and data lines 103 which intersect each other at right angles act to display an image. It is required that the area of these pixel regions is made as large as possible.

In the structure shown in FIG. 1(A), it is necessary to form the capacitor lines 102 within the regions. This narrows the pixel regions accordingly. That is, the conventional structure has the disadvantage that the aperture ratio is low.

As shown also in FIG. 1(A), the pixel electrodes 104 are so formed as to overlap neither the gate lines 101 nor the data lines 103; otherwise parasitic capacitance would be created, thus adversely affecting the liquid crystal display, e.g., the operating speed of the liquid crystal display is lowered.

When a voltage is applied, the edges of the pixel electrodes 104 disturb the electric field, thus deteriorating the displayed image such as blurring of the image. Therefore, the edges are placed outside the field of view. That is, some contrivance is necessary to mask the edges.

Furthermore, it is necessary that the semiconductor layer 105 forming the active layer of the TFT be shielded against extraneous light, for the following reason. If light impinges on the semiconductor layer, its conductivity is changed by photoexcitation.

To provide such light shielding, a black matrix (BM) is normally formed either on the TFT substrate or on the counter substrate. A region which is within the field of view when the black matrix is disposed is shown in FIG. 1(B).

Referring to FIG. 1(B), all of gate lines 101, capacitor lines 102, data lines 103, and semiconductor layer 105 are covered with the black matrix to prevent them from lying within the field of view. Consequently, a region indicated by 108 is the effective image display region.

As described above, the capacitor lines 102 narrow the pixel regions excessively and lead to a deterioration of the aperture ratio.

SUMMARY OF THE INVENTION

The present invention is intended to provide a technique for solving the foregoing problems of the prior art technique. That is, it is an object of the present invention to provide a technique for fabricating pixel regions with a high aperture ratio.

The present invention provides a liquid crystal display having gate lines and data lines arranged in rows and columns on the same substrate, pixel electrodes disposed at the intersections of the gate lines and data lines, and TFTs connected with the pixel electrodes. The liquid crystal display comprises a first interlayer dielectric film that covers the gate lines, a second interlayer dielectric film formed by LPD (liquid phase deposition) so as to cover the data lines, a black matrix formed over the TFTs via the second interlayer dielectric film, a third interlayer dielectric film formed by LPD so as to cover the black matrix, and pixel electrodes formed on the third interlayer dielectric film. A retaining capacitance is created between the black matrix and each of the pixel electrodes via the third interlayer dielectric film.

The present invention also provides a liquid crystal display having gate lines and data lines arranged in rows and columns on the same substrate, pixel electrodes disposed at the intersections of the gate lines and data lines, and TFTs connected with the pixel electrodes. The liquid crystal display comprises a first interlayer dielectric film that covers the gate lines, a second interlayer dielectric film formed by LPD (liquid phase deposition) so as to cover the data lines, a black matrix formed over the TFTs, gate lines, and data-lines via the second interlayer dielectric film, a third interlayer dielectric film formed by LPD so as to cover the black matrix, and pixel electrodes formed on the third interlayer dielectric film. A retaining capacitor is formed between the black matrix and each of the pixel electrodes via the third interlayer dielectric film. The second interlayer dielectric film consists of one or more layers of an organic resinous material. The third interlayer dielectric film consists of one or more layers of an organic resinous material or inorganic material. The third interlayer dielectric film has a relative dielectric constant larger than that of the second interlayer dielectric film.

Furthermore, the present invention provides a method of fabricating a liquid crystal display having gate lines and data lines arranged in rows and columns on the same substrate, pixel electrodes disposed at the intersections of the gate lines and data lines, and TFTs connected with the pixel electrodes. This method comprises the steps of: forming a first interlayer dielectric film that covers the gate lines; forming a second interlayer dielectric film out of an organic resinous material by LPD so as to cover the data lines; forming a black matrix film out of a metal over the second interlayer dielectric film; forming a third interlayer dielectric film out of an organic resinous material or inorganic material by LPD so as to cover the black matrix film; forming contact holes in the second and third films; and forming pixel electrodes out of a transparent conductive film on the third interlayer dielectric film. A retaining capacitance is formed between the black matrix and each of the pixel electrodes via the third interlayer dielectric film.

Intrinsically, the black matrix film acts as a light-blocking layer. The present invention is characterized in that the black matrix film also acts to form electrodes for creating retaining capacitors. In another feature of the invention, the interlayer dielectric films are formed out of an organic resinous material by LPD, which is also known as liquid phase deposition or spin coating.

FIG. 2(A) is a top view of pixel regions of a liquid crystal display fabricated in accordance with the present invention. Shown in this figure are gate lines 201 extending from gate electrodes and data lines 202 for transmitting an image signal.

The gate lines 201 and data lines 202 are arranged in rows and columns on the same substrate. TFTs are disposed at the intersections of these two kinds of lines. A semiconductor layer 203 forms the active layers of these TFTs.

A black matrix 204 is disposed over the gate lines 201, data lines 202, and semiconductor layer 203 so as to shield them. The data lines 202 are electrically isolated from the black matrix 204 by a second interlayer dielectric film having a thickness of 0.1 to 5.0 μm. This second interlayer dielectric film consists of one or more layers which are formed out of an organic resinous material by LPD.

Pixel electrodes 205 are formed over the black matrix 204 via a third interlayer dielectric film consisting of one or more layers of an organic resinous material or inorganic material. The third interlayer dielectric film is formed by LPD and 0.1–0.3 μm thick.

In this structure, the pixel electrodes 205 and the black matrix 204 are at different levels and overlap each other via the third interlayer dielectric film in regions 206, thus forming capacitances. In the present invention, these capacitances are used as retaining capacitors.

In one main feature of the invention, the third interlayer dielectric layer has a relative dielectric constant larger than that of the second interlayer dielectric layer. As the difference between the relative dielectric constants of the second and third interlayer dielectric layers is increased, more desirable results arise.

It is assumed that the second interlayer dielectric film has a smaller relative dielectric constant of about 2.0 to 4.0 and that the third interlayer dielectric film has a larger relative dielectric constant of 3.0 to 30, preferably approximately 5 to 20. Typical examples of the material having relative dielectric constants of about 5 to 20 include silicon oxide-based dielectric films as consisting of SOG, BSG, and PSG.

The advantages of the structure described above are next described briefly. Parasitic capacitances formed between the black matrix 204 and each of the gate lines 201 and data lines 202 can be reduced to a minimum by reducing the relative dielectric constant of the second interlayer dielectric film.

Furthermore, the capacitances of the retaining capacitors created between the black matrix .204 and the pixel electrodes 205 can be increased by increasing the relative dielectric constant of the third interlayer dielectric film.

Accordingly, if the second and third interlayer dielectric films are made from the same material, the parasitic capacitances can be reduced and the retaining capacitors can be increased by making these two dielectric films have different relative dielectric constants.

The configuration of the present invention as described above is hereinafter described in further detail in connection with its preferred embodiments.

BRIEF DESCRIPTION OF THE DRAWINGS

FIGS. 7(A) and 7(B) are views illustrating the configuration of auxiliary capacitors in a liquid crystal display.

DETAILED DESCRIPTION OF THE PREFERRED EMBODIMENTS

EMBODIMENT 1

Figure 1A:
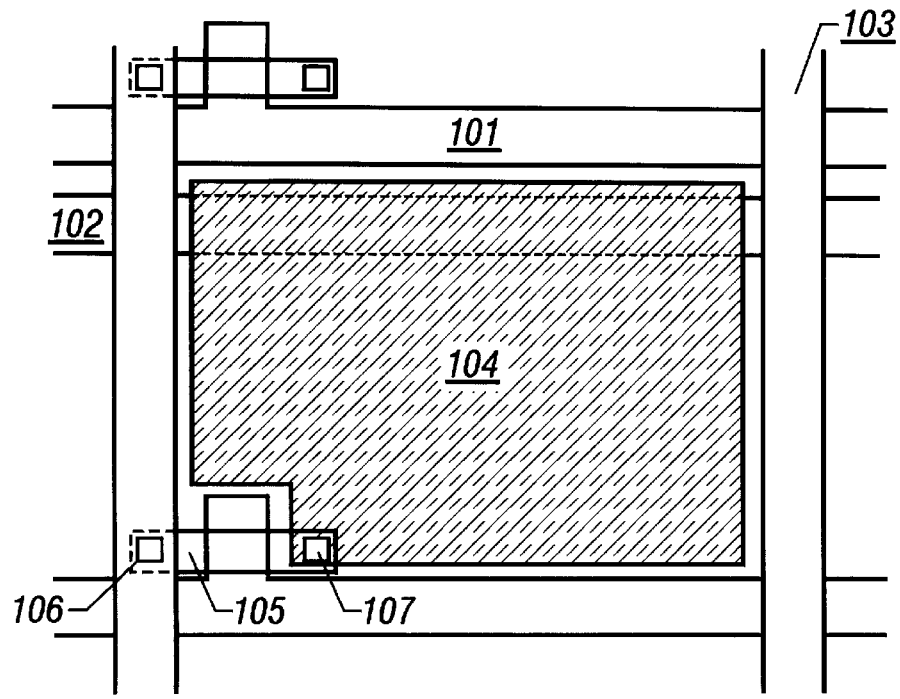
FIGS. 1(A) and 1(B) are views illustrating the configuration of the pixel regions of a liquid crystal display.
Figure 1B:
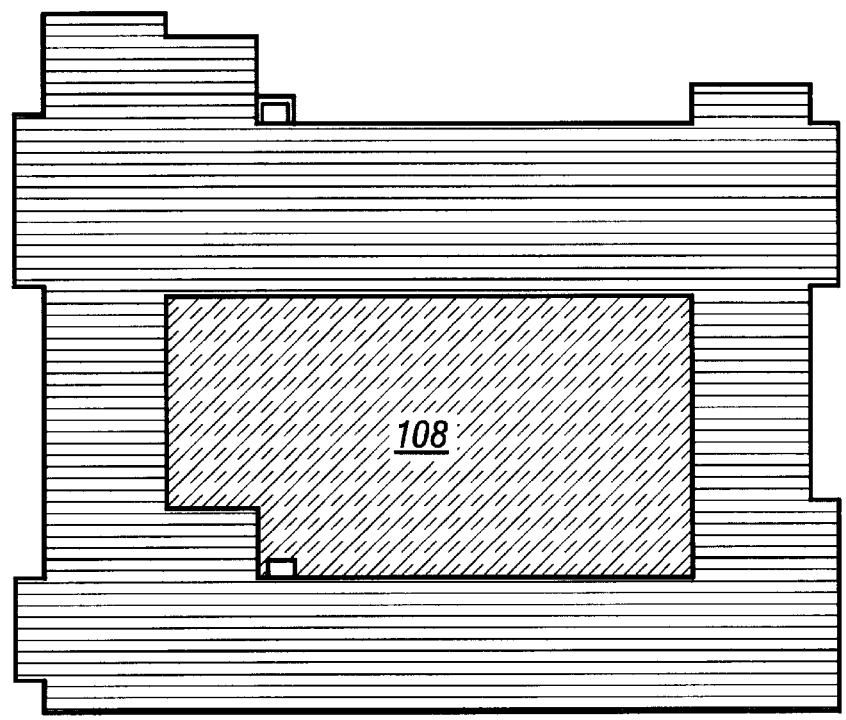
Figure 2A:
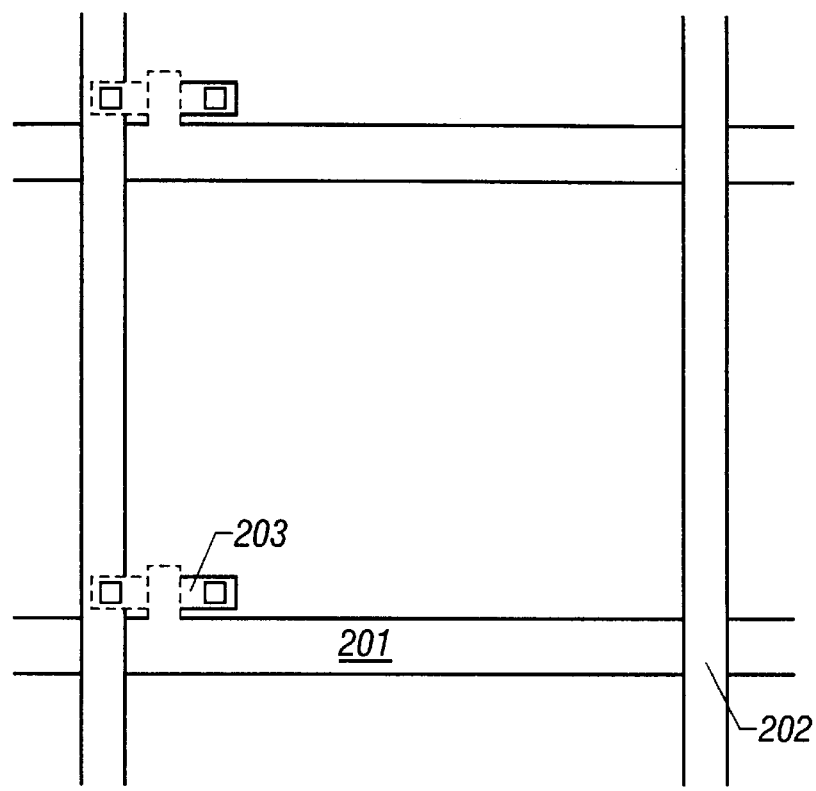
FIGS. 2(A) and 2(B) are views illustrating the configuration of the pixel regions of a liquid crystal display.

The present embodiment represents an example in which pixel regions having the structure shown in FIG. 2(A) are fabricated by making use of the present invention. A technique for creating retaining capacitors by means of a black matrix and pixel electrodes is described in detail.

FIGS. 3(A)–3(D) illustrate a process sequence for fabricating pixel TFTs forming the pixel regions shown in FIG. 2(A). A glass substrate 301 has a dielectric film having a thickness of 2000 Å as a buffer layer. First, an amorphous silicon film (not shown) is formed on the substrate to a thickness of 200 to 500 Å. The dielectric film is formed from silicon oxide ($SiO_2$), silicon oxynitride ($SiO_xN_y$), silicon nitride (SiN), or other material by plasma CVD, LPCVD, sputtering, or other method.

Then, the amorphous silicon film (not shown) is crystallized by using either heating or laser annealing or both. If a metal element for promoting the crystallization is added, then the crystallization will be carried out effectively.

On completion of the crystallization, the crystallized silicon film (not shown) is patterned to form islands of semiconductor layer 302, followed by formation of a silicon oxide film 303 having a thickness of 1200 Å. This silicon oxide film 303 will act as a gate-insulating film later. Of course, the film 303 may be made from silicon oxynitride or silicon nitride.

Then, a conductive coating 304 is grown to a thickness of 2000 to 2500 Å. In the present embodiment, an aluminum film containing 0.2% by weight of scandium is used as the coating 304. The scandium serves to suppress hillocks, whiskers, and other projections which would otherwise be produced on the aluminum surface during heat treatment or other processing step. This aluminum film 304 will act as gate electrodes later.

Figure 3A:
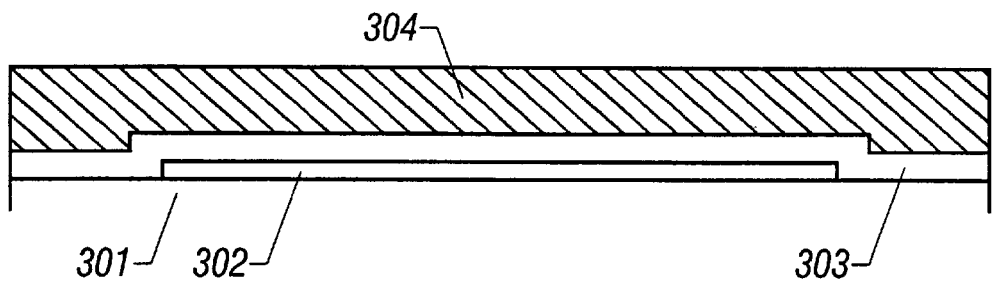
FIGS. 3(A)–3(D) are views schematically illustrating a process sequence for fabricating a pixel TFT.

In this way, a state shown in FIG. 3(A) is obtained. Then, anodization is effected within an electrolytic solution, using the aluminum film 304 as an anode. The electrolytic solution is prepared by neutralizing ethylene glycol solution of a 3% tartaric acid with aqueous ammonia so that the pH is adjusted to 6.92.

A platinum cathode is used. An electrical current of 5 mA is passed. The voltage is increased up to 10 V.

In this way, a dense, thin anodic oxide film (not shown) is formed. This anodic oxide film serves to improve the adhesion to photoresist deposited later when the aluminum film 304 is patterned. The film thickness can be controlled by controlling the voltage application time.

Then, the aluminum film 304 is patterned to form the gate electrodes (not shown). It is to be noted, however, that what effectively acts as gate electrodes are those portions of the bulk of the material which are finally left after passing through an anodic oxidation step (described later).

Figure 3B:
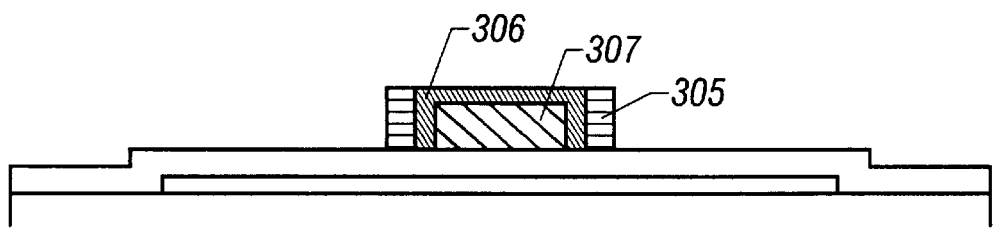

Thereafter, the second anodization is carried out to form a porous anodic oxide film 305 (FIG. 3(B)). An aqueous solution of a 3% oxalic acid is used as an electrolytic solution. A platinum cathode is employed. An electrical current of 2–3 mA is passed. The voltage is increased up to 8 V.

At this time, the anodization proceeds in a direction parallel to the substrate. The length of the porous anodic oxide film 305 can be controlled by controlling the voltage application time.

Then, the photoresist (not shown) which was used to pattern the aluminum film is removed with a proprietary stripping solution, followed by execution of a third anodization. Thus, a state shown in FIG. 3(B) is obtained.

At this time, the used electrolytic solution is prepared by neutralizing ethylene glycol solution of a 3% tartaric acid with aqueous ammonia so that the pH is adjusted to 6.92. A platinum cathode is used. An electrical current 5–6 mA is passed. The voltage is increased up to 40–100 V.

An anodic oxide film 306 formed at this time is very dense and tough. Therefore, this film protects the gate electrodes 307 against damage and heat in subsequent processing steps such as doping step. The thickness of the oxide film 306 is 500 to 1500 Å.

Then, dopants are implanted into the islands of semiconductor layer 302 by ion doping. Where N-channel TFTs should be fabricated, P+ ions are introduced as the dopants. Where P-channel TFTs are manufactured, B+ ions are introduced as the dopants.

Under the state of FIG. 3(B), first ion implantation is carried out. In the present embodiment, P+ ions are implanted at an accelerating voltage of 80 kV with a dose of $1\times10^{15}$ atoms/cm$^2$.

Figure 3C:
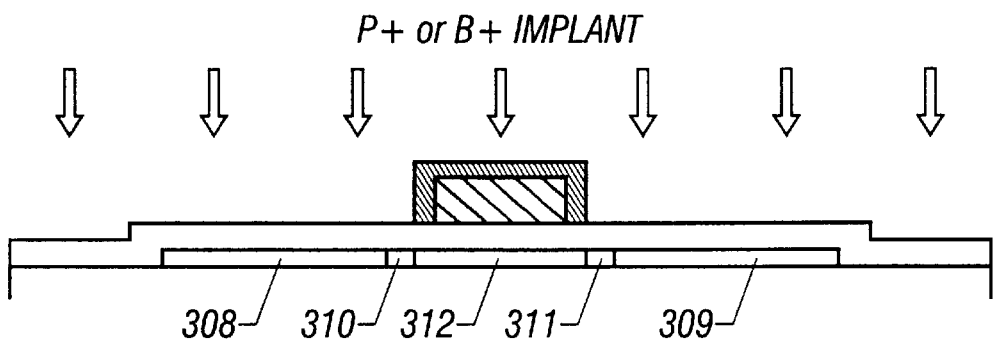
Figure 3D:
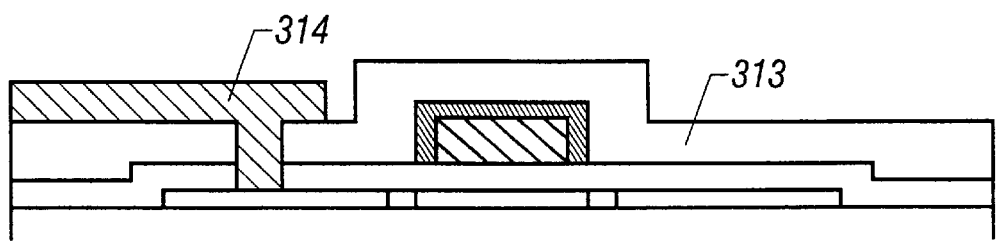

As a result, regions 308 and 309 which will become source/drain regions are formed by self-aligned technology while the gate electrodes 307 and the porous anodic oxide film 305 are used as a mask (FIG. 3(C)).

Then, as shown in FIG. 3(C), the porous anodic oxide film 305 is removed. Second ion implantation is done, using P+ ions, at an accelerating voltage of 80 kV with a dose of $1\times10^{14}$ atoms/cm$^2$.

Then, the gate electrodes 307 act as a mask. Lightly doped regions 310 and 311 of a lower doping level than the source region 308 and drain region 309 are formed by self-aligned technology.

At the same time, a region 312 acting as the channel of the TFT is formed by self-aligned technology, because no dopant is implanted at all immediately under the gate electrode 307.

The lightly doped region (referred to as LDD region) 311 acts to suppress development of a high electric field between the channel region 312 and the drain region 309.

Then, a KrF excimer laser light is irradiated at an energy density of 200 to 300 mJ/cm$^2$ to activate the implanted P+ ions. The activation may also be performed by thermal annealing at 300 to 450° C. for 2 hour. The laser annealing and thermal annealing may be used in conjunction (in combination).

Thereafter, a first interlayer dielectric film 313 is formed by plasma CVD. This film 313 may be made from silicon oxide, silicon oxynitride, silicon nitride, or other material. The thickness is 0.5 to 1.0 μm.

After forming the first dielectric film 313, contact holes are formed in the source region 308, and an aluminum film (not shown) is deposited to a thickness of 3000 Å. This aluminum film (not shown) is then patterned to form source electrodes 314 (FIG. 3(D)).

A second interlayer dielectric film 315 is formed to a thickness of 0.1 to 5.0 μm so as to cover the source electrodes 314. In the present embodiment, the thickness is 1.5 μm. This second interlayer dielectric film 315 is made from an organic resinous material. In the present embodiment, a transparent polyimide having a relative dielectric constant of 2.8 is deposited as the organic resinous material by LPD.

Since such an organic resinous material is deposited by LPD, a coating can be formed easily. Furthermore, a large film thickness is readily obtained. The second interlayer dielectric film mitigates the irregularities due to the device topography. In consequence, excellent surface flatness can be accomplished.

It is also possible to use a fluorine-based resinous material having a smaller relative dielectric constant of 2.1–2.2, for example. In this case, the parasitic capacitances between the black matrix (formed later) and source/gate interconnects can be reduced more effectively.

Then, a titanium film is deposited as the black matrix 316 on the second interlayer dielectric film 315 to a thickness of 1000 Å. Of course, a film of other metal such as chromium or aluminum may be used (FIG. 4(A)).

Figure 4A:
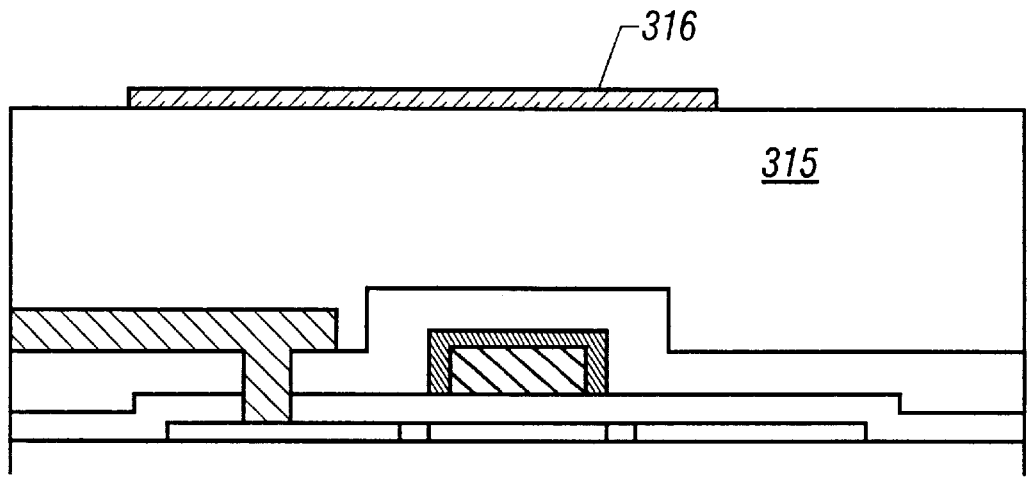
FIGS. 4(A) and 4(B) are views schematically illustrating a process sequence for fabricating a pixel TFT.

After obtaining the state of FIG. 4(A), a third interlayer dielectric film 317 is formed to a thickness of 0.1 to 0.3 μm so as to cover the black matrix 316. Although the third interlayer dielectric film 317 is made from an organic resinous material, it is important that the third interlayer dielectric film 317 have a relative dielectric constant larger than that of the second interlayer dielectric film 315. In the present embodiment, a transparent polyimide having a relative dielectric constant of 4.1 is deposited by LPD.

The material of the third interlayer dielectric film 317 is not limited to organic resins. Inorganic dielectric films having larger relative dielectric constants can also be used. Preferably, a silicon oxide-based dielectric film which can be deposited by LPD is used as such inorganic dielectric film. In this case, very large relative dielectric constants of about 5 to 20 can be obtained.

Then, contact holes are formed to permit connection with the drain region 309. Pixel electrodes 318 as consisting of a transparent conductive film of ITO or the like are formed. The thickness of the pixel electrodes 318 is 1000 to 1200 Å.

These pixel electrodes are so laid out that they overlap the black matrix 316 in a maximum area achievable.

In this case, the surface of the third interlayer dielectric film 317 exhibits excellent flatness. Therefore, the pixel electrodes 318 formed on it also shows excellent flatness. This eliminates inadequate rubbing during assembly of the cells and disturbance of the applied electric field to the liquid crystal.

Figure 2B:
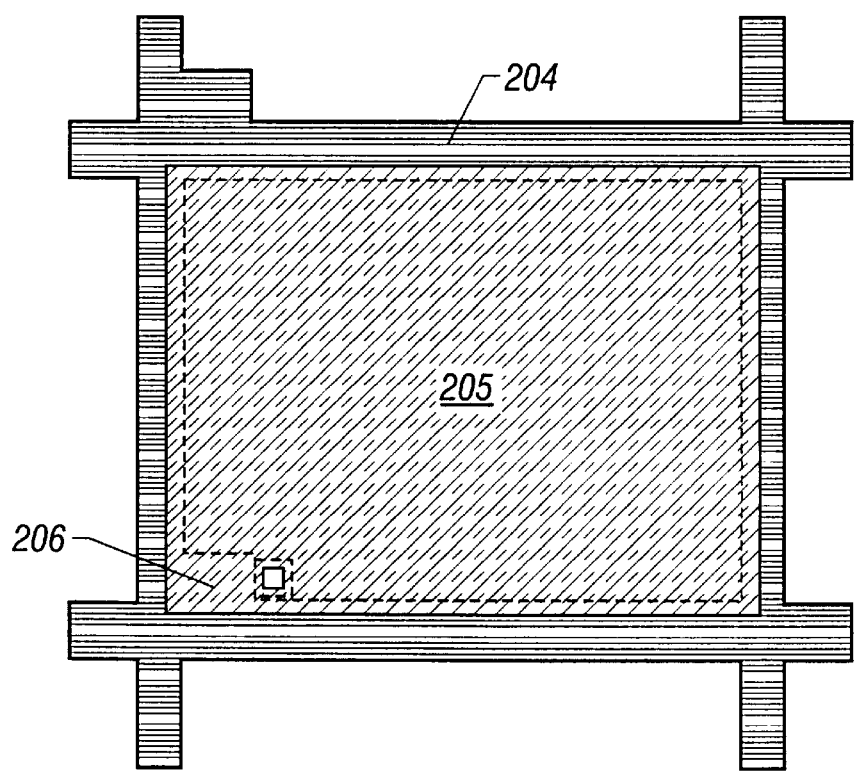
Figure 4B:
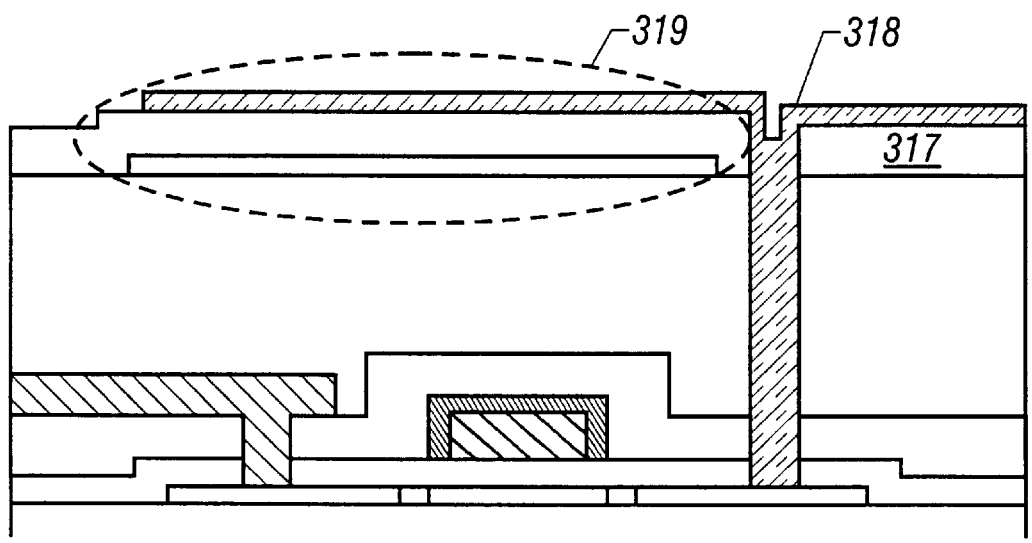

Pixels TFTs as shown in FIG. 4(B) are fabricated through the processing steps as described thus far. At this time, a pixel TFT region 319 surrounded by the dotted line in FIG. 4(B) corresponds to the region indicated by 206 in FIG. 2(B). That is, this region 319 acts to retain electric charge. The capacitance of this retaining capacitor is in proportion to the relative dielectric constant of the third interlayer dielectric film 317 and inversely proportional to the film thickness.

In the pixel electrodes 318, regions (FIG. 4(B)) located to the right of the contacts to the drain electrodes 309 which do not create retaining capacitors over the pixel TFTs extend to the pixel regions where an image is displayed.

Retaining capacitances are created in every region (including the region 319 shown in FIG. 4(B)) where the black matrix 316 overlaps the pixel electrodes 318. These regions correspond to those regions of FIG. 2(B) where the black matrix 204 overlaps the pixel electrodes 205.

Therefore, retaining capacitors having desired capacitance can be designed by calculating the area of the black matrix 316 overlapping the pixel electrodes 318, as well as the thickness and relative dielectric constant of the third interlayer dielectric film 317.

The second interlayer dielectric film 315 has a small relative dielectric constant, and its thickness can be set to as large as 0.1 to 5.0 μm. Consequently, the parasitic capacitances created between the black matrix 316 and the gate and data lines can be reduced down to a negligible level.

This structure permits removal of the conventional capacitance lines. Retaining capacitors can be formed, utilizing the black matrix. For this purpose, the following requirements must be met:

(1) A dielectric film having a minimum relative dielectric constant is used as the second interlayer dielectric film. The thickness of this film is set large.

(2) A dielectric film having a maximum relative dielectric constant is used as the third interlayer dielectric film. The thickness of this film is set small.

Owing to the merits of the structure described above, retaining capacitors having the minimum necessary capacitance can be created while suppressing the parasitic capacitances without sacrificing the aperture ratio.

Although not illustrated in the present embodiment, where a driver circuit is built on the same substrate, driver TFTs and pixel TFTs are fabricated at the same time. For example, if the fact that the driver circuit is incorporated into an active matrix liquid crystal display as in the present embodiment is taken into account, N- and P-channel TFTs of the CMOS structure, i.e., combined complementarily, are used for the driver circuit. Pixel TFTs as illustrated in the present embodiment are disposed in the pixel regions.

Where the present invention is applied to such a liquid crystal display, 9 or 10 pattern masks are needed. Therefore, the process is not complicated.

The aforementioned driver TFTs are manufactured by the same process steps as used for fabrication of pixel TFTs. However, no pixel electrodes are necessary. The driver TFTs are completed by fabricating drain electrodes simultaneously with source electrodes 314 in FIG. 3(D).

EMBODIMENT 2

The present embodiment differs from the configuration shown in FIG. 2 in that a black matrix is formed only above the TFTS. The greatest feature of the present embodiment is that the black matrix is replaced by gate lines and data lines.

Figure 5:
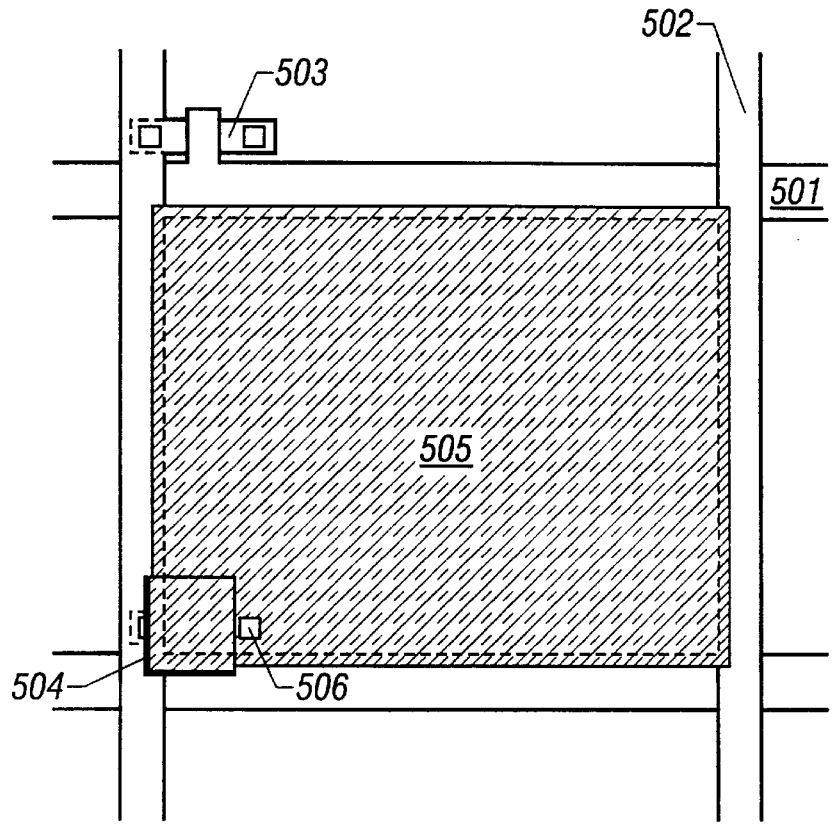
FIG. 5 is a view illustrating the configuration of the pixel regions of a liquid crystal display.

In the configuration shown in FIG. 5, there are shown gate lines 501, data lines 502, a semiconductor layer 503 forming the active layer of TFTs, the black matrix 504, pixel electrodes 505, and contacts 506 between the semiconductor layer 503 and the pixel electrodes 505.

It is to be noted that in the present embodiment, the edges of the pixel electrodes 505 overlap the gate lines 501 and the data lines 502. In this case, parasitic capacitances which would normally be created between the gate lines 501 and the pixel electrodes 505 and between the data lines 502 and the pixel electrodes 505 present problems.

In the present embodiment, the second interlayer dielectric film 315 acting as the dielectric layer of each parasitic capacitor is made from a material having a small relative dielectric constant. Furthermore, the second interlayer dielectric film can be made thick. Therefore, the parasitic capacitances can be reduced to such a level that no adverse effect is produced.

Retaining capacitances are created between the black matrix 504 and the pixel electrodes 505 via the third interlayer dielectric film 317. As mentioned previously, the third interlayer dielectric film 317 is as thin as 0.1 to 0.3 μm and has a relative dielectric constant larger than that of the second interlayer dielectric film 315. Consequently, the capacitance is large enough to act as a retaining capacitance.

Since the black matrix 504 does not narrow the pixel regions inwardly, a higher aperture ratio can be accomplished.

EMBODIMENT 3

In the present embodiment, the LPD (liquid phase deposition) used in fabricating the second or third interlayer dielectric film in Embodiment 1 is described. The LPD is a means for obtaining a desired film by dissolving an organic resinous material or inorganic material in a solvent, applying the resulting solution to a substrate to be processed, and baking the applied solution. The process sequence for fabricating the pixel TFTs and driver TFTs has been already described in Embodiment 1 and so will not be described now.

The manner in which a film is formed by LPD is described below briefly. In the description provided below, the film is made of silicon oxide-based material ($SiO_x$) that is an inorganic material. Another example of the inorganic material of the film is SiOF having a relative dielectric constant of 3.2–3.3. A transparent polyimide having a relative dielectric constant of 2.8–3.4 can be used as an organic resinous material.

First, an $H_2SiF_6$ solution is prepared as a solvent. Then, $SiO_2{:}xH_2O$ is added to the solution and stirred for 3 hours. At this time, the processing temperature is maintained at 30° C. Thereafter, the solution is passed through a filter, and an adjustment is made so that a desired concentration is obtained. On completion of the adjustment, the solution is stirred while warmed with a water bath or the like until 50° C. is reached.

In this way, preparations for a solution to be applied are made. For example, if $H_3BO_3$ is added to this solution, a silicon oxide-based film (a film made from so-called BSG) containing B+ ions can be formed.

After immersing the substrate to be processed in the solution prepared by the procedure described above, the substrate is rinsed in DI water (pure water) and dried or baked, thus completing the film. Silicon oxide-based dielectric films include materials having large dielectric constants of about 5–20. If such a material is used as the third interlayer dielectric film, auxiliary capacitors having larger capacitances can be secured.

If an organic resinous material should be applied, a desired solution to be applied is prepared, and then the solution is applied by LPD to form a film. Where a film is formed from an organic resinous material, the solution is applied to the substrate to be processed, the substrate being held on a spinner. This spinner is rotated at 2000 rpm. Then, the film is baked or sintered at 300° C. for about 30 minutes to improve the quality of the film.

Where LPD is utilized, a desired film can be fabricated with relative ease as described above. That is, the throughput can be improved greatly. The film thickness can be adjusted at will by the immersion time (where a spinner is used, the rotational speed or the like) or by the concentration of the solution and, therefore, a thick flat film can be readily formed.

Where CVD is employed in forming the third interlayer dielectric film, it follows that the substrate is placed in a CVD chamber while the organic resinous material forming the second interlayer dielectric film is exposed. This tends to incur contamination of the interior of the chamber due to organic materials, leading to undesirable results. However, if the third interlayer dielectric film is formed by LPD, such problems are circumvented.

EMBODIMENT 4

In the present embodiment, a second retaining capacitance is used in addition to the retaining capacitance (referred to herein as the first retaining capacitance) according to the present invention. This second retaining capacitance has been invented, based on our research.

This second retaining capacitance is formed by gate lines and pixel electrodes via a first interlayer dielectric film. This will be described in detail by referring to FIG. 6.

Figure 6:
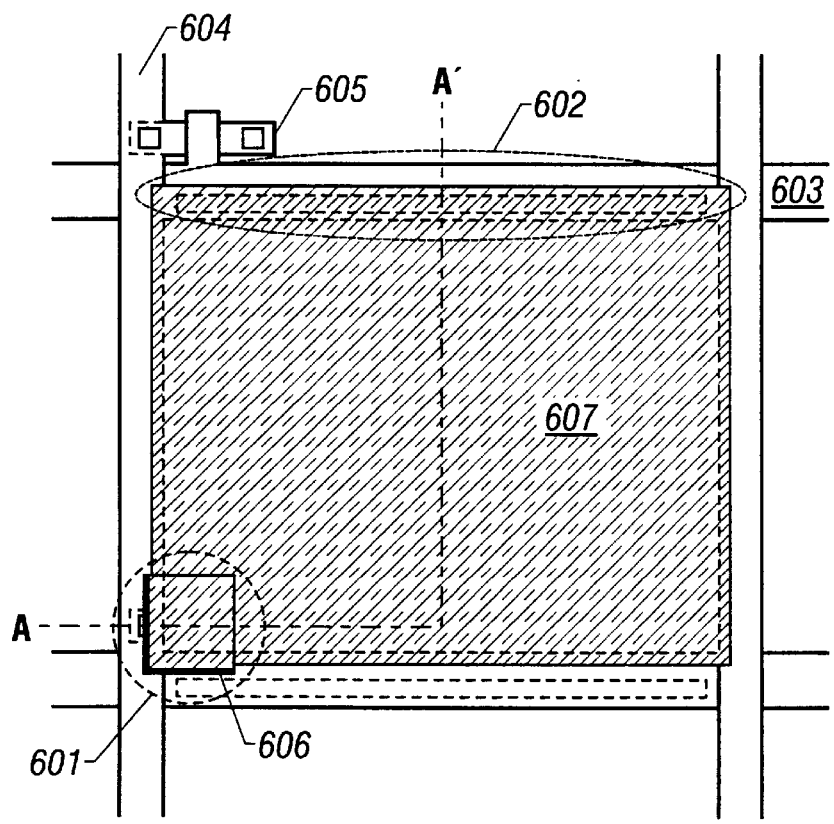
FIG. 6 is a view illustrating the configuration of the pixel regions of a liquid crystal display.

FIG. 6 is a top view of pixel regions where the first retaining capacitance (region surrounded by broken line 601) according to the invention and the aforementioned second retaining capacitance (region surrounded by broken line 602) according to the invention are used in conjunction (in combination).

Shown in this figure are gate lines 603, data lines 604, and a semiconductor layer 605 forming the active layer of TFTS.

The fabrication sequence for the first retaining capacitance 601 has been already described in Embodiment 1. A process sequence for the second retaining capacitance 602 is described briefly by referring to FIG. 7. Those portions which form the TFTs are similar to the corresponding parts of Embodiment 1 and thus will not be described in detail below. Only required portions are denoted by the same reference numerals as used in Embodiment 1.

FIGS. 7(A) and 7(B) are cross-sectional views taken along the broken line A-A' of FIG. 6.

The process sequence of Embodiment 1 is carried out until the third interlayer dielectric film is formed, thus obtaining a state shown in FIG. 7(A). A titanium film 606 forms a black matrix. Gate lines 603 extend from gate electrodes 307.

Under this condition, the first interlayer dielectric film 313, the second interlayer dielectric film 315, and the third interlayer dielectric film 317 are stacked on the gate lines 603.

Then, the second interlayer dielectric film 315 and the third interlayer dielectric film 317 overlying the gate lines 603 are etched to form window holes, thus creating pixel electrodes 607. Indicated by 608 are the edges of the pixel electrodes arranged in the adjacent pixel regions.

At this time, the first retaining capacitance 601 is formed between the black matrix 606 and the pixel electrodes 607 via the third interlayer dielectric film 317. The second retaining capacitance 602 is formed over the gate lines 603 via the first interlayer dielectric film 313 between the gate lines 603 and the pixel electrodes 607.

The second retaining capacitance 602 is free of the second interlayer dielectric film 315 having a small relative dielectric constant and a large film thickness. Therefore, only the first interlayer dielectric layer 313 can be used as its dielectric layer. Hence, a retaining capacitor having a sufficient capacitance can be formed by selecting a material of a large relative dielectric constant as the first interlayer dielectric film 313 and decreasing the film thickness.

Furthermore, in the present embodiment, the gate lines 603 and data lines 604 can be used as the black matrix, as already described in Embodiment 2. Unlike Embodiment 2, the second retaining capacitance formed by the gate lines and pixel electrodes is formed, in addition to the first retaining capacitance which is formed by the black matrix and the pixel electrodes. Therefore, sufficient capacitance can be secured.

As described thus far, retaining capacitors of sufficient capacitance can be created. Moreover, pixel regions of a high aperture ratio can be accomplished.

EMBODIMENT 5

The present embodiment is similar to Embodiment 1 or 4 except that a rear exposure method is used in fabricating pixel electrodes. This will be described by referring to FIGS. 8(A) to 8(C).

The process sequence of Embodiment 1 is carried out until the third interlayer dielectric film is formed. An ITO film becoming pixel electrodes is deposited on the third interlayer dielectric film. The ITO film is patterned with a negative resist mask which is characterized in that exposed regions are left behind when peeled.

Figure 8A:
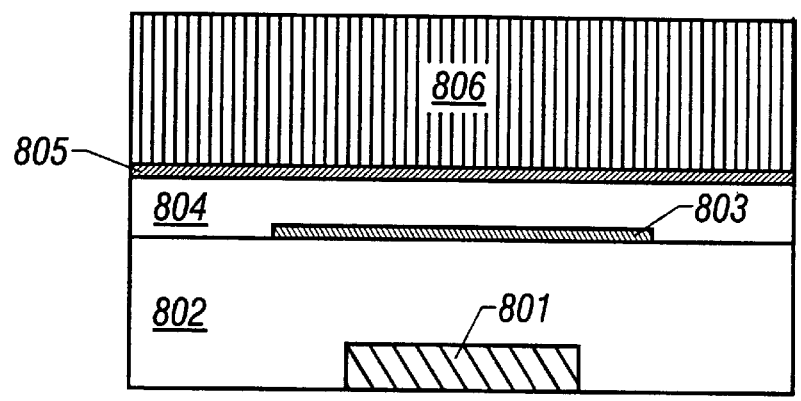
FIGS. 8(A)–8(C) are views illustrating a back-side exposure method.
Figure 8B:
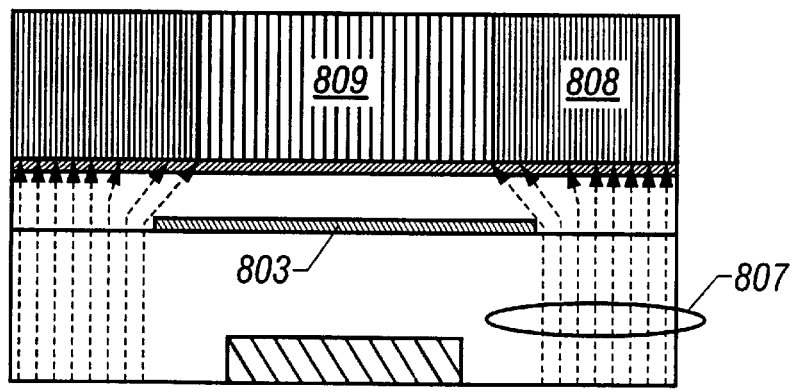
Figure 8C:
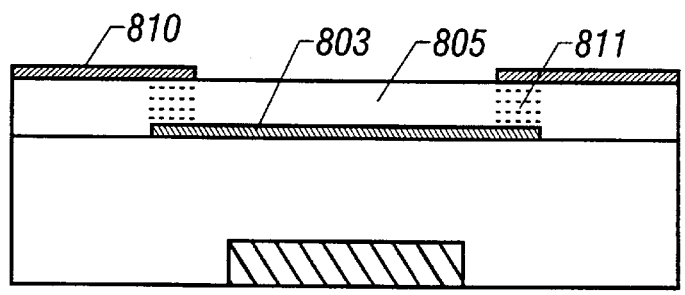

The state in which the rear surface is being exposed by light is described by referring to FIGS. 8(A) to 8(C), where gate lines (or data lines) 801, a second interlayer dielectric film 802, and a black matrix 803 are shown. The black matrix 803 is electrically isolated from the gate lines 801 by the second interlayer dielectric film 802.

The black matrix 803 is covered with a third interlayer dielectric film 804. An ITO film 805 becoming pixel electrodes is deposited on the third interlayer dielectric film 804. The aforementioned negative resist mask is indicated by 806 (FIG. 8(A)).

Under this condition, exposing radiation 807 is irradiated. As shown in FIG. 8(B), the resist mask 806 is exposed and developed. Of the resist mask 806, regions 808 irradiated with the exposing radiation 807 will be left behind during a later peeling step. Those regions 809 not irradiated with the exposing radiation 807 will be peeled away by the peeling step.

It is to be noted that in the present embodiment, a region becoming an auxiliary capacitor is secured by making use of diffraction of light. When rear surface exposure as in the present embodiment is done in practice, the radiation reaches the rear side of the black matrix 803, making the regions 809 narrower than the black matrix 803.

Also, in the present invention, the third interlayer dielectric film 805 is as thin as 0.1 to 0.3 μm. Therefore, scattering of diffracted light is prevented; otherwise the boundary between the regions 808 and 809 would be blurred. In addition, the regions 809 will have a uniform width.

After the exposure, the unexposed regions 809 are removed with a proprietary stripping solution or the like. Using the exposed, left regions 808 as a mask, the ITO film is etched away, thus obtaining a state as shown in FIG. 8(C).

In FIG. 8(C), an ITO film 810 which has been patterned acts as pixel electrodes. The black matrix 803 and pixel electrodes 810 overlap the regions 811 via the third interlayer dielectric film 805, thus creating regions serving as auxiliary capacitances. The width of these regions 811 corresponds to the difference in width between the black matrix 803 and the regions 809.

The regions 811 formed in this way and acting as auxiliary capacitances are formed by self-aligned technology by the rear surface exposure. Moreover, they are formed at exactly the same width at opposite ends of the black matrix 803 for the reason described above. That is, variations in capacitances of the auxiliary capacitors can be eliminated.

EMBODIMENT 6

The present embodiment is an example of application of the present invention to amorphous and super-multidomain AM LCD. In this case, an optically active material is added to a TN material which is widely used as a liquid crystal material. Hence, any rubbing step is dispensed with.

EMBODIMENT 7

The present embodiment is an example of application of the present invention to a field-effect mode liquid crystal display. Such modes can be classified into five modes: twisted-nematic (TN) mode, supertwisted nematic (STN) mode, electric field control birefringence (ECB) mode, phase transition (PC) mode, and guest-host (GH) mode.

These modes of operation consume only small amounts of electric power. Also, lower driving voltages are used. Therefore, these modes of operation are characterized by low power consumption. Because of this feature, they have enjoyed the widest acceptance.

EMBODIMENT 8

The present embodiment is an example of application of the present invention to a dynamic scattering mode liquid crystal display. This mode makes use of an electric field effect. In addition, scattering of light caused by flow disturbance is used in providing a display, the disturbance being due to the presence of an ion additive introduced in the liquid crystal material.

EMBODIMENT 9

The present embodiment is an example of the present invention to a thermal-effect mode liquid crystal display. In this mode, a phase transition of a liquid crystal material due to temperature is controlled by heating. The resulting optical characteristic change is used to provide a display.

According to the present invention disclosed herein, it is easy to form retaining capacitors by making use of a black matrix which has been heretofore used as a shading film, for the following reasons.

First, the black matrix is formed on the second interlayer dielectric film which has a small relative dielectric constant and a large film thickness. Hence, parasitic capacitance created between the black matrix and gate lines and between the black matrix and data lines can be suppressed.

Secondly, the third interlayer dielectric film which has a large relative dielectric constant and a small film thickness is formed on the black matrix. Consequently, retaining capacitors having sufficient capacitance can be formed between the black matrix and the pixel electrodes created on the third interlayer dielectric film.

The present invention as described thus far yields the following advantages. Retaining capacitance can be created without the prior art capacitance lines by utilizing a black matrix. Therefore, a liquid crystal display having a high aperture ratio can be manufactured by making the best use of the pixel regions.

What is claimed:

1. An electro-optical device comprising:
   a data line:
   a black matrix provided over said data line;
   an interlayer dielectric film provided on said black matrix; and
   a pixel electrode provided on said interlayer dielectric film.

2. The device of claim 1 wherein said black matrix comprises titanium, chromium or aluminum.

3. The device of claim 1 wherein said interlayer dielectric film is formed by liquid phase deposition.

4. The device of claim 1 wherein said electro-optical device is a twisted-nematic mode liquid crystal display, a supertwisted nematic mode liquid crystal display, an electric field control birefringence mode liquid crystal display, a phase transition mode liquid crystal display, a guest-host mode liquid crystal display or a thermal-effect mode liquid crystal display.

5. The device of claim 1 wherein said pixel electrode comprises a transparent conductive film.

6. The device of claim 1, wherein said black matrix, said interlayer dielectric film and said pixel electrode constitute a retaining capacitor.

7. An electro-optical device comprising:
   a black matrix;
   a resin layer provided on said black matrix; and
   a pixel electrode provided on said resin layer,
   wherein said black matrix, said resin layer and said pixel electrode constitute a retaining capacitor.

8. The device of claim 7 wherein said resin layer is an interlayer dielectric film.

9. The device of claim 7 wherein said black matrix comprises titanium, chromium or aluminum.

10. The device of claim 7 wherein said resin layer is formed by liquid phase deposition.

11. The device of claim 7 wherein said electro-optical device is a twisted-nematic mode liquid crystal display, a supertwisted nematic mode liquid crystal display, an electric field control birefringence mode liquid crystal display, a phase transition mode liquid crystal display, a guest-host mode liquid crystal display or a thermal-effect mode liquid crystal display.

12. The device of claim 7 wherein said pixel electrode comprises a transparent conductive film.

13. An electro-optical device comprising:

a gate line;

a black matrix provided over said gate line;

an interlayer dielectric film provided on said black matrix; and a pixel electrode provided on said interlayer dielectric film, wherein said black matrix, said interlayer dielectric film and said pixel electrode constitutes a retaining capacitor.

14. An electro-optical device comprising:

two data lines provided in parallel with each other and adjacent to each other;

two gate lines provided in parallel with each other and adjacent to each other;

a pixel TFT region surrounded by parts of said two data lines and said two gate lines;

a black matrix provided on said parts of said two data lines and said two gate lines;

an interlayer dielectric film provided on said black matrix; and a pixel electrode provided on said interlayer dielectric film, wherein said black matrix surrounds said pixel along said parts of said two data lines and said two gate lines, and wherein said black matrix, said interlayer dielectric film and said pixel electrode constitute a retaining capacitor.

15. An electro-optical device comprising:

two data lines provided in parallel with each other and adjacent to each other;

two gate lines provided in parallel with each other and adjacent to each other;

a pixel TFT region surrounded by parts of said two data lines and said two gate lines;

a black matrix provided on said parts of said two data lines and said two gate lines;

an interlayer dielectric film provided on said black matrix;

a pixel electrode provided on said interlayer dielectric film; and a thin film transistor connected with said pixel electrode and covered with said black matrix, wherein said black matrix surrounds said pixel along said parts of said two data lines and said two gate lines, and wherein said black matrix, said interlayer dielectric film and said pixel electrode constitute a retaining capacitor.

16. An electro-optical device comprising:

two data lines provided in parallel with each other and adjacent to each other;

two gate lines provided in parallel with each other and adjacent to each other;

a pixel TFT region surrounded by parts of said two data lines and said two gate lines;

a black matrix provided on said parts of said two data lines and said two gate lines;

an interlayer dielectric film comprising organic resin or inorganic material provided on said black matrix; and a pixel electrode provided on said interlayer dielectric film, wherein said black matrix surrounds said pixel along said parts of said two data lines and said two gate lines, and wherein said black matrix, said interlayer dielectric film and said pixel electrode constitute a retaining capacitor.

17. An electro-optical device comprising:

two data lines provided in parallel with each other and adjacent to each other;

two gate lines provided in parallel with each other and adjacent to each other;

a pixel TFT region surrounded by parts of said two data lines and said two gate lines;

a black matrix provided on said parts of said two data lines and said two gate lines through at least one interlayer dielectric film;

another interlayer dielectric film provided on said black matrix; and a pixel electrode provided on said another interlayer dielectric film, wherein said black matrix surrounds said pixel along said parts of said two data lines and said two gate lines, wherein said black matrix, said another interlayer dielectric film and said pixel electrode constitute a retaining capacitor, and wherein said another interlayer dielectric film has a relative dielectric constant larger than that of said at least one interlayer dielectric film.

18. The device of claim 17 wherein said at least one interlayer dielectric film comprises an organic resin.

* * * * *

UNITED STATES PATENT AND TRADEMARK OFFICE
CERTIFICATE OF CORRECTION

PATENT NO. : 6,118,506
DATED : September 12, 2000
INVENTOR(S) : Shunpei Yamazaki, Jun Koyama, Naoaki Yamaguchi, Katunobu Awane, Funiaki Funada, and Yoshitaka Yamamoto It is certified that error appears in the above-identified patent and that said Letters Patent is hereby corrected as shown below:

Title page,
Under [73] ASSIGNEE, please add the following entity: SHARP KABUSHIKI KAISHA, Osaka, Japan Signed and Sealed this Eighteenth Day of September, 2001

Attest:

*Nicholas P. Godici*

*Attesting Officer*

NICHOLAS P. GODICI
*Acting Director of the United States Patent and Trademark Office*